United States Patent
Jung et al.

(10) Patent No.: US 9,373,376 B2
(45) Date of Patent: Jun. 21, 2016

(54) LATENCY CONTROL CIRCUIT AND SEMICONDUCTOR APPARATUS USING THE SAME

(71) Applicant: SK hynix Inc., Icheon-si Gyeonggi-do (KR)

(72) Inventors: Jong Ho Jung, Icheon-si (KR); Da In Im, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 68 days.

(21) Appl. No.: 14/305,890

(22) Filed: Jun. 16, 2014

(65) Prior Publication Data
US 2015/0263739 A1   Sep. 17, 2015

(30) Foreign Application Priority Data
Mar. 11, 2014   (KR) .......................... 10-2014-0028159

(51) Int. Cl.
| H03L 7/00 | (2006.01) |
| G11C 7/22 | (2006.01) |
| H03L 7/08 | (2006.01) |
| G11C 7/10 | (2006.01) |
| G11C 19/00 | (2006.01) |

(52) U.S. Cl.
CPC .............. *G11C 7/222* (2013.01); *G11C 7/1057* (2013.01); *G11C 7/1066* (2013.01); *H03L 7/0807* (2013.01); *G11C 19/00* (2013.01); *G11C 2207/2272* (2013.01)

(58) Field of Classification Search
CPC ................................................... H03L 7/0807
USPC .................. 327/149, 150, 153, 158, 161, 261
See application file for complete search history.

(56) References Cited

U.S. PATENT DOCUMENTS

| 6,437,619 | B2* | 8/2002 | Okuda ................. G11C 7/1051 327/156 |
| 2008/0101140 | A1* | 5/2008 | Jeong ........................ G11C 7/22 365/193 |
| 2011/0187427 | A1* | 8/2011 | Kim .......................... H03L 7/06 327/158 |
| 2014/0010029 | A1* | 1/2014 | Jung ....................... G11C 7/222 365/194 |

FOREIGN PATENT DOCUMENTS

KR   1020150142851 A   12/2015

* cited by examiner

*Primary Examiner* — William Hernandez
(74) *Attorney, Agent, or Firm* — William Park & Associates Ltd.

(57) ABSTRACT

A latency control circuit may include a first latency control section configured to control a latency of a delay-locked termination signal according to a first divided clock signal, and generate a first preliminary signal, and a second latency control section configured to control the latency of the delay-locked termination signal according to a first divided clock bar signal which is generated by inverting the first divided clock signal, and generate a second preliminary signal. The latency control circuit may also include a signal combination unit configured to shift the first preliminary signal and the second preliminary signal by latency values set differently from each other, according to the first divided clock signal, and generate a first combined signal and a second combined signal, and a signal generation unit configured to generate a latency-controlled termination signal in response to the first combined signal and the second combined signal.

20 Claims, 13 Drawing Sheets

LATENCY CONTROL CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2014-0028159, filed on Mar. 11, 2014, in the Korean Intellectual Property Office, which is incorporated herein by reference in its entirety.

BACKGROUND

1. Technical Field

Various embodiments generally relate to a semiconductor circuit, and more particularly, to a latency control circuit and a semiconductor apparatus using the same.

2. Related Art

A semiconductor apparatus may need to perform an on-die termination (hereinafter, referred to as 'termination') operation for matching the impedance of a final end to a desired value. For example, a final end may include an input/output pad.

A termination signal (ODT) for allowing the semiconductor apparatus to perform the termination operation may be received from a source exterior to the semiconductor apparatus.

The semiconductor apparatus may be provided with a command based on an external clock signal.

SUMMARY

In an embodiment, a latency control circuit may include a first latency control section configured to receive a delay-locked termination signal, control a latency of the delay-locked termination signal according to a first divided clock signal, and generate a first preliminary signal. The latency control circuit may also include a second latency control section configured to receive a delay-locked termination signal, control the latency of the delay-locked termination signal according to a first divided clock bar signal, and generate a second preliminary signal. The latency control circuit may also include a signal combination unit configured to receive the first preliminary signal and the second preliminary signal, shift the first preliminary signal and the second preliminary signal by latency values set differently from each other, according to the first divided clock signal, and generate a first combined signal and a second combined signal. The latency control circuit may also include a signal generation unit configured to generate a latency-controlled termination signal in response to the first combined signal and the second combined signal, wherein the first divided clock bar signal is an inverted first divided clock signal.

In an embodiment, a semiconductor apparatus may include a delay-locked loop configured to perform delay compensation for a termination signal and generate a delay-locked termination signal, and perform delay compensation for an external clock signal and generate a first divided clock signal and a second divided clock signal through division. The semiconductor apparatus may include a latency control circuit configured to control a latency of the delay-locked termination signal according to the first divided clock signal and a first divided clock bar signal which is generated by inverting the first divided clock signal, respectively, through separate signal paths and generate a first preliminary signal and a second preliminary signal, and combine two signals which are generated by shifting the first preliminary signal and the second preliminary signal by latency values set differently from each other, according to the first divided clock signal and generate a latency-controlled termination signal. The semiconductor apparatus may also include and an input/output circuit configured to terminate an input/output pad in response to the latency-controlled termination signal.

DETAILED DESCRIPTION

Hereinafter, a latency control circuit and a semiconductor apparatus using the same according to the present disclosure will be described below with reference to the accompanying drawings through various examples of embodiments.

A semiconductor apparatus may be provided with a command based on an external clock signal. In this regard, it may be necessary to compensate for a signal processing delay time inside the semiconductor apparatus.

Thus, with an aim to compensate for signal processing delay inside the semiconductor apparatus with respect to the external clock signal, a delay-locked loop (DLL) may be used.

Since the termination signal (ODT) is also provided from an external source, it may also be necessary to compensate for signal processing delays inside the semiconductor apparatus, and thus, latency control may be implemented in conformity with a delay-locked clock signal which may be generated in the delay-locked loop.

Figure 1:
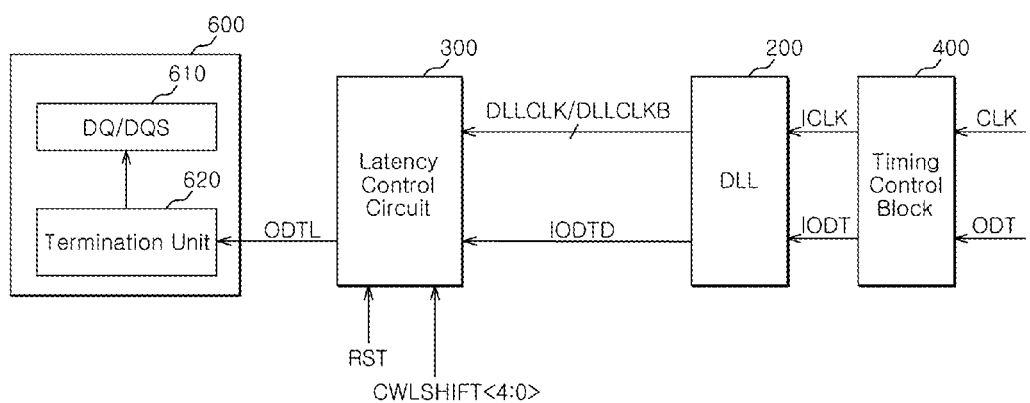
FIG. 1 is an illustration of a block diagram representation of a semiconductor apparatus in accordance with an embodiment.

Now referring to FIG. 1, a semiconductor apparatus 100, for example, may include a delay-locked loop (DLL) 200, a latency control circuit 300, and an input/output circuit 600.

The semiconductor apparatus 100 in accordance with an embodiment may further include a timing control block 400.

The delay-locked loop 200 may be configured to perform delay compensation for a clock signal ICLK and generate delay-locked clock signals DLLCLK and DLLCLKB. The delay-locked loop 200 may be configured to perform delay compensation for a termination signal IODT and generate a delay-locked termination signal IODTD.

The delay-locked clock signal DLLCLK and the delay-locked clock signal DLLCLKB may have opposite phases from each other.

The latency control circuit 300 may be configured to control the latency of the delay-locked termination signal IODTD in response to latency control signals CWLSHIFT<4:0> and the delay-locked clock signals DLLCLK and DLLCLKB. The latency control circuit 300 may also be configured to generate a latency-controlled termination signal ODTL.

The latency control circuit 300 may be configured to initialize the latency-controlled termination signal ODTL in response to a reset signal RST.

The input/output circuit 600 may be configured to terminate a final end, that is, an input/output pad (DQ/DQS) 610, in response to the latency-controlled termination signal ODTL.

The input/output circuit 600 may include the input/output pad 610 and a termination unit 620.

The input/output circuit 600 may be configured to allow the termination unit 620 to terminate the input/output pad 610 in response to the latency-controlled termination signal ODTL.

The timing control block 400 may be configured to buffer an external clock signal CLK and an external termination signal ODT. The timing control block 400 may be configured to provide the clock signal ICLK and the termination signal IODT to the delay-locked loop 200.

When there is an additive latency (AL), the timing control block 400 may apply the additive latency to the external termination signal ODT, perform buffering, and output the termination signal IODT.

Figure 2:
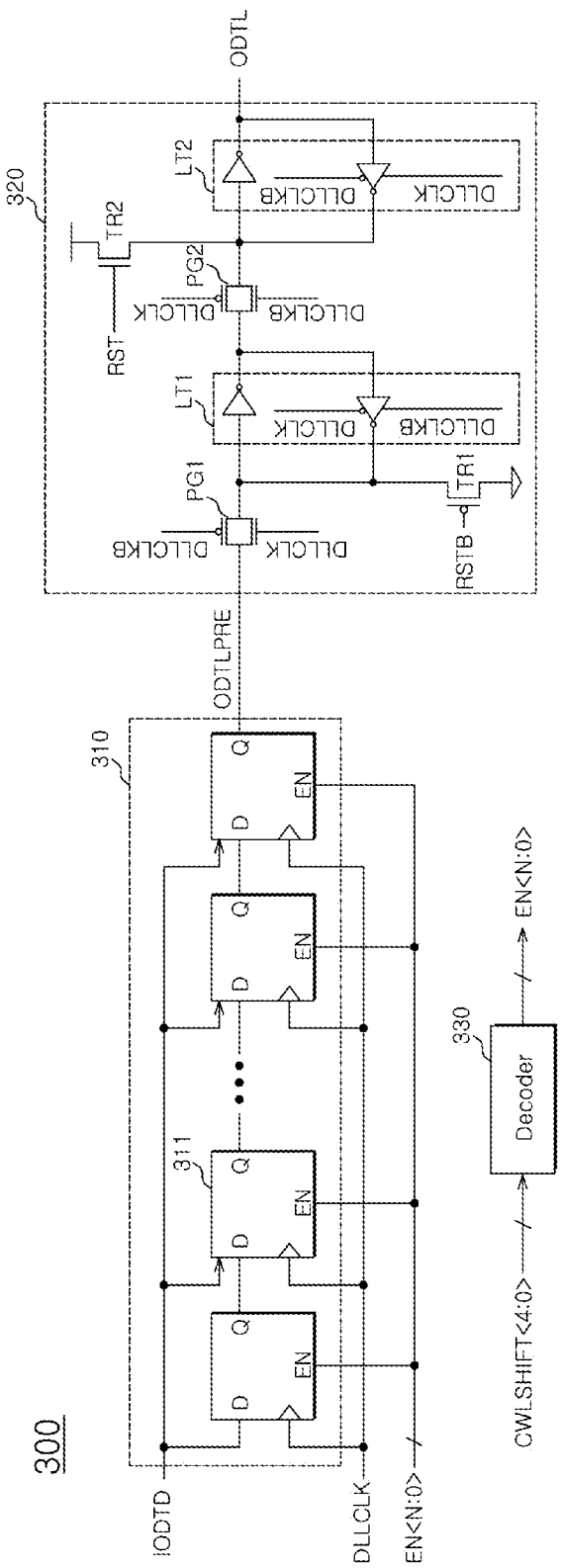
FIG. 2 is a circuit diagram illustrating a representation of the configuration of the latency control circuit illustrated in FIG. 1.

Referring to FIG. 2, the latency control circuit 300 may include a latency control unit 310 and a signal generation unit 320. The latency control circuit 300 may also include a decoder 330.

The decoder 330 may be configured to decode the latency control signals CWLSHIFT<4:0>, and generate shift control signals EN<N:0> (where N may be a natural number greater than 0).

The termination latency regulation, for example, is a column address strobe CAS write latency (CWL) minus one and a half times one cycle time of the external clock signal CLK (i.e., CWL−1.5 tCK). One (i.e., 1) tCK is one cycle time of the external clock signal CLK.

The latency control signals CWLSHIFT<4:0> may be signals which define a value obtained by controlling a CWL value such that the latency-controlled termination signal ODTL generated via the latency control unit 310 and the signal generation unit 320 satisfies the termination latency regulation, that is, for example, CWL−1.5.

The latency control unit 310 may be configured to control the latency of the delay-locked termination signal IODTD according to the delay-locked clock signals DLLCLK and DLLCLKB in response to the shift control signals EN<N:0>, and generate a preliminary latency-controlled termination signal ODTLPRE.

The latency control unit 310 may include a plurality of (for example, N number of) flip-flops 311 (i.e., where N is a natural number greater than 0).

The plurality of flip-flops 311 are inputted with output signals Q of previous flip-flops 311 and the delay-locked termination signal IODTD.

The plurality of flip-flops 311 are activated in response to signal bits corresponding to them, among the shift control signals EN<N:0>.

The plurality of flip-flops 311 may be configured in such a way that the flip-flops 311 activated among the plurality of flip-flops 311 shift the delay-locked termination signal IODTD according to the delay-locked clock signals DLLCLK and DLLCLKB.

The signal generation unit 320 may be configured to control the latency of the preliminary latency-controlled termination signal ODTLPRE according to the delay-locked clock signals DLLCLK and DLLCLKB, and generate the latency-controlled termination signal ODTL.

The signal generation unit 320 may be configured to initialize the latency-controlled termination signal ODTL in response to reset signals RST and RSTB.

The signal generation unit 320 may include a plurality of pass gates PG1 and PG2, a plurality of transistors TR1 and TR2, and a plurality of latches LT1 and LT2.

The pass gate PG1 may store the preliminary latency-controlled termination signal ODTLPRE in the latch LT1 in response to the rising edge of the delay-locked clock signal DLLCLK.

The pass gate PG2 may store the signal stored in the first latch LT1, in the second latch LT2 in response to the falling edge of the delay-locked clock signal DLLCLK, and at the same time or substantially the same time, may output the latency-controlled termination signal ODTL.

The plurality of transistors TR1 and TR2 may initialize the levels of the signals stored in the plurality of latches LT1 and LT2 in response to the reset signals RSTB and RST, and thereby initialize the latency-controlled termination signal ODTL.

Figure 3:
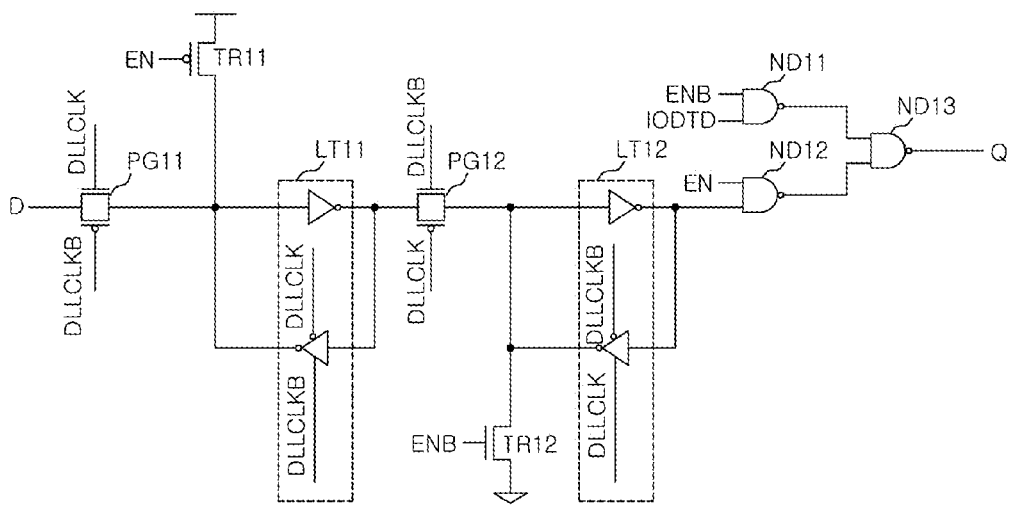
FIG. 3 is a circuit diagram illustrating a representation of the configuration of the flip-flop illustrated in FIG. 2.

Referring to FIG. 3, the flip-flop 311 may include a plurality of pass gates PG11 and PG12 and a plurality of transistors TR11 and TR12. The flip-flop 311 may also include a plurality of latches LT11 and LT12 and a plurality of logic gates ND11 to ND13.

The pass gate PG11 may store an input signal D in the latch LT11 in response to the rising edge of the delay-locked clock signal DLLCLK. The input signal D may be the output signal Q of a previous flip-flop 311.

In response to the falling edge of the delay-locked clock signal DLLCLK the pass gate PG12 may store the signal stored in the latch LT11 in the second latch LT12.

In response to the deactivation of a shift control signal ENB, the plurality of logic gates ND11 to ND13 may bypass the delay-locked termination signal IODTD and transmit the delay-locked termination signal IODTD to a next flip-flop 311.

In response to the activation of a shift control signal EN the plurality of logic gates ND11 to ND13 may transmit the signal stored in the latch LT12 to the next flip-flop 311.

The shift control signal ENB may be a signal having a phase opposite to the shift control signal EN. The sift control signal ENB may be generated by inverting the shift control signal EN.

In response to the deactivation of the shift control signals EN and ENB the plurality of transistors TR11 and TR12 may control the levels of the signals stored in the plurality of latches LT11 and LT12, and thereby allow the delay-locked termination signal IODTD to be bypassed through the logic gates ND11 and ND13.

Figure 4:
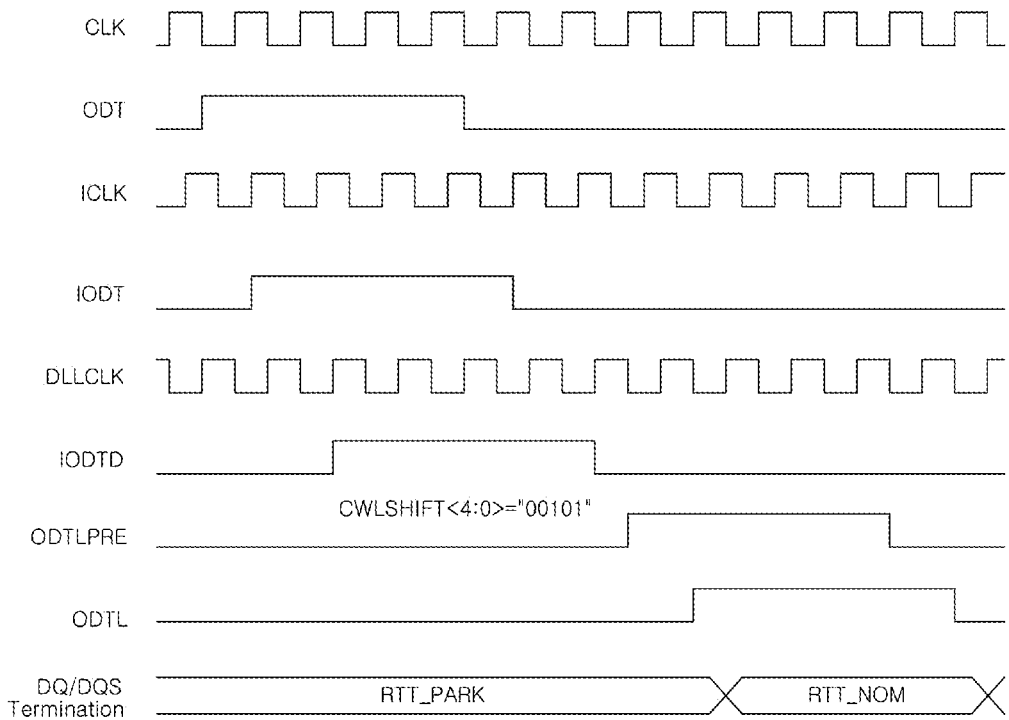
FIG. 4 is an illustration of an embodiment of a latency control timing diagram of the semiconductor apparatus.

The latency control operation of the semiconductor apparatus 100 in accordance with an embodiment, configured as mentioned above, will be described below with reference to FIG. 4.

The external termination signal ODT is inputted on the basis of the external clock signal CLK.

The external termination signal ODT is outputted as the termination signal IODT on the basis of the clock signal ICLK, via the timing control block 400.

The termination signal IODT is outputted as the delay-locked termination signal IODTD on the basis of the delay-locked clock signal DLLCLK, via the delay-locked loop 200.

The delay-locked termination signal IODTD is latency-controlled by a time set by the latency control signals CWL-SHIFT<4:0>, via the latency control unit 310 of the latency control circuit 300, and is outputted as the preliminary latency-controlled termination signal ODTLPRE.

The preliminary latency-controlled termination signal ODTLPRE is outputted as the latency-controlled termination signal ODTL via the signal generation unit 320 of the latency control circuit 300.

According to the latency-controlled termination signal ODTL, the input/output pad (DQ/DQS) 610 of the input/output circuit 600 is terminated to a preset resistance value.

The input/output pad 610 of the input/output circuit 600 has a first resistance value RTT_PARK during the deactivation period of the latency-controlled termination signal ODTL, and has a second resistance value RTT_NOM during the activation period of the latency-controlled termination signal ODTL.

Figure 5:
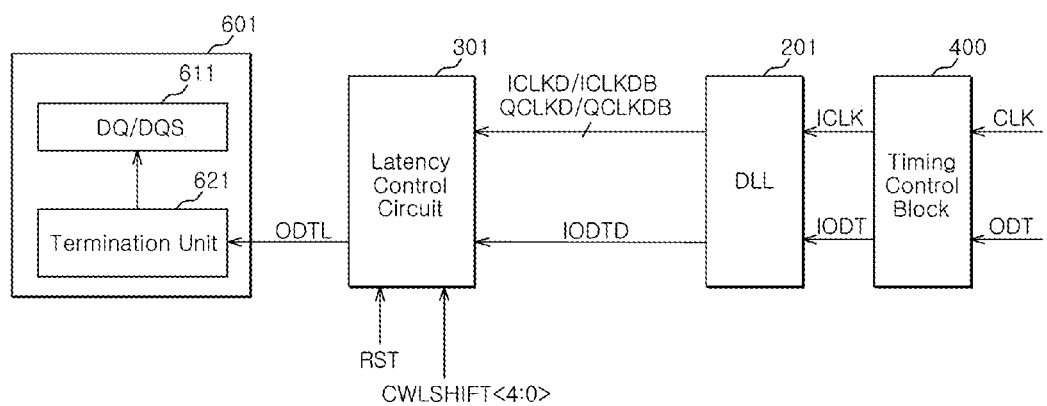
FIG. 5 is an illustration of an embodiment of a block diagram of a semiconductor apparatus.

Referring to FIG. 5, a semiconductor apparatus 101 in accordance with an embodiment may include a delay-locked loop (DLL) 201 and a latency control circuit 301. The semiconductor apparatus 101 may also include an input/output circuit 601.

The semiconductor apparatus 101 may further include a timing control block 400.

The delay-locked loop 201 may be configured to perform delay compensation for a clock signal ICLK and generate delay-locked clock signals. The delay-locked loop 201 may be configured to perform delay compensation for a termination signal IODT, and generate a delay-locked termination signal IODTD.

The delay-locked loop 201 may divide the delay-locked clock signals with a predetermined division ratio, for example, by 2, and generate divided clock signals ICLKD, ICLKDB, QCLKD and QCLKDB.

The delay-locked loop 201 may generate the delay-locked clock signals according to the clock signal ICLK which is acquired by buffering an external clock signal CLK. The delay-locked loop 201 may generate the divided clock signals ICLKD, ICLKDB, QCLKD and QCLKDB by dividing the delay-locked clock signals. Therefore, the divided clock signals ICLKD, ICLKDB, QCLKD and QCLKDB may be signals which are divided on the basis of the external clock signal CLK.

Figure 6:
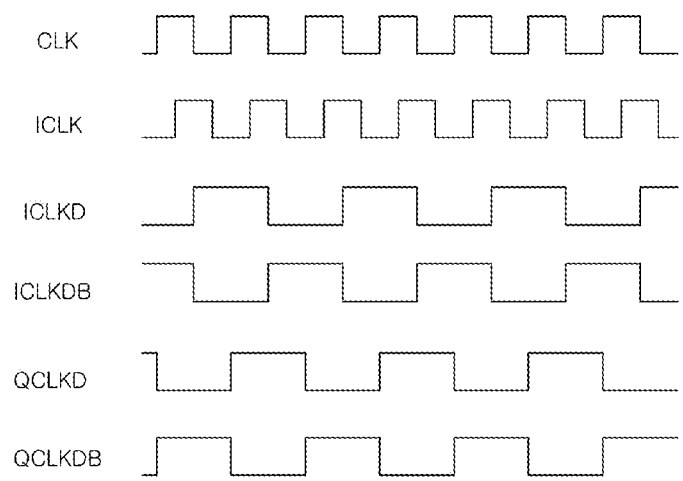
FIG. 6 is an illustration of a representation of a waveform diagram of the divided clock signals illustrated in FIG. 5.

Referring to FIG. 6, the divided clock signals ICLKD, ICLKDB, QCLKD and QCLKDB may each have different phases. Thus, there may be four different phases each divided clock signal ICLKD, ICLKDB, QCLKD and QCLKDB having a different phase than the other three divided clock signal phases.

Hereinafter, the divided clock signal ICLKD will be referred to as a first divided clock signal ICLKD. Hereinafter, the divided clock signal QCLKD will be referred to as a second divided clock signal QCLKD.

The divided clock signals ICLKD and ICLKDB may have opposite phases to each other. The divided clock signals QCLKD and QCLKDB may have opposite phases to each other.

Accordingly, the divided clock signal ICLKDB may be referred to as a first divided clock bar signal ICLKDB. The divided clock signal QCLKDB may be referred to as a second divided clock bar signal QCLKDB.

In the following descriptions, the divided clock signals ICLKD and ICLKDB and the divided clock signals QCLKD and QCLKDB are used in pairs in a pass gate (for example, a pass gate PG21 of FIG. 8), a tri-state inverter of a latch (for example, a latch LT21 of FIG. 8), and so forth. Hereinbelow, descriptions will be made mainly with respect to the divided clock signal ICLKD between the divided clock signals ICLKD and ICLKDB and with respect to the divided clock signal QCLKD between the divided clock signals QCLKD and QCLKDB.

The latency control circuit 301 may be configured to control the latency of the delay-locked termination signal IODTD in response to latency control signals CWLSHIFT<4:0> and the first and second divided clock signals ICLKD and QCLKD, and generate a latency-controlled termination signal ODTL.

In response to a reset signal RST the latency control circuit 301 may be configured to initialize the latency-controlled termination signal ODTL.

In response to the latency-controlled termination signal ODTL the input/output circuit 601 may be configured to terminate a final end. The final end may include an input/output pad (DQ/DQS) 611.

The input/output circuit 601 may include the input/output pad 611. The input/output circuit 601 may also include a termination unit 621.

The input/output circuit 601 may be configured to allow the termination unit 621 to terminate the input/output pad 611 in response to the latency-controlled termination signal ODTL.

The timing control block 400 may be configured to buffer the external clock signal CLK and an external termination signal ODT, and provide the clock signal ICLK and the termination signal IODT to the delay-locked loop 201.

When there is an additive latency (AL), the timing control block 400 may apply the additive latency to the external termination signal ODT, perform buffering, and output the termination signal IODT.

Figure 7:
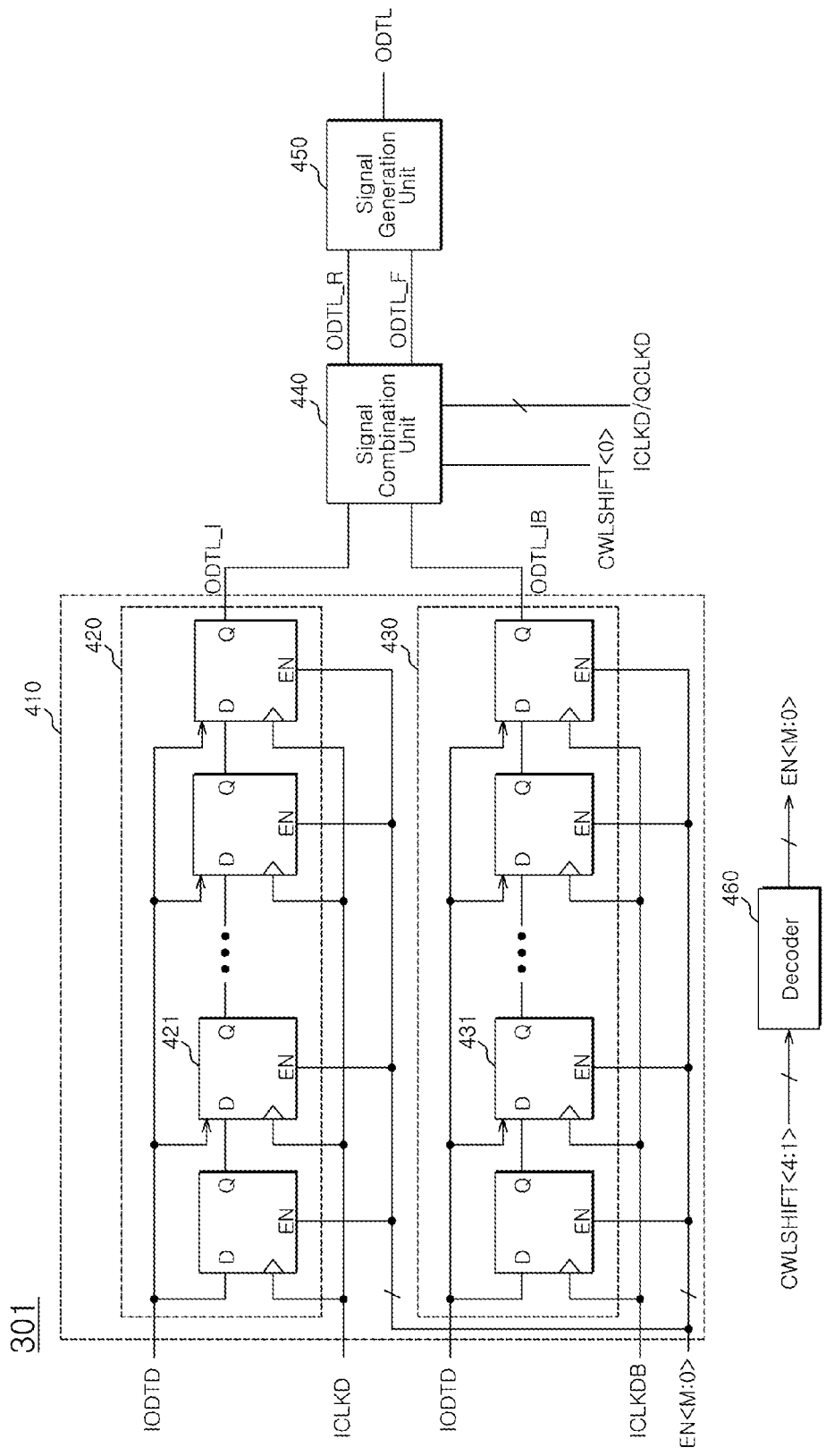
FIG. 7 illustrates a representation of a circuit diagram illustrating the configuration of the latency control circuit illustrated in FIG. 5.

Referring to FIG. 7, the latency control circuit 301 may be configured to generate a first preliminary signal ODTL_I and a second preliminary signal ODTL_IB by controlling the delay-locked termination signal IODTD by a predetermined latency value from the rising edge of the first divided clock signal ICLKD and the rising edge of the first divided clock bar signal ICLKDB, respectively, through separate signal paths, and generate the latency-controlled termination signal ODTL by combining the first preliminary signal ODTL_I and the second preliminary signal ODTL_IB.

In the latency control circuit 301, a latency value may be set according to the latency control signals CWLSHIFT<4:1> which remain by excluding the specified signal bit CWLSHIFT<0> among the latency control signals CWLSHIFT<4:0>.

The specified signal bit CWLSHIFT<0> is information capable of determining whether the value of the latency control signals CWLSHIFT<4:0> are even or odd.

The latency control circuit 301 may be configured to combine the first preliminary signal ODTL_I and the second preliminary signal ODTL_IB according to the specified signal bit CWLSHIFT<0> among the latency control signals CWLSHIFT<4:0>.

The latency control circuit 301 may be configured to generate the latency-controlled termination signal ODTL in response to a first combined signal ODTL_R and a second combined signal ODTL_F which are generated by combining the first preliminary signal ODTL_I and the second preliminary signal ODTL_IB.

The latency control circuit 301 may include a latency control unit 410 and a signal combination unit 440. The latency control circuit 301 may also include a signal generation unit 450 and a decoder 460.

The decoder 460 may be configured to decode the latency control signals CWLSHIFT<4:1> which remain by excluding the specified signal bit CWLSHIFT<0> among the latency control signals CWLSHIFT<4:0>, and generate shift control signals EN<M:0>.

The value of M of the shift control signals EN<M:0> may be, for example, a value corresponding to one half of the value of N of the shift control signals EN<N:0> of FIG. 2.

The termination latency regulation is, for example, a CAS write latency (CWL) minus one and a half times the cycle time of the external clock signal CLK (i.e., CWL−1.5 tCK). One (1) tCK is one cycle time of the external clock signal CLK.

The latency control signals CWLSHIFT<4:0> may be signals which define a value obtained by controlling a CWL value such that the latency-controlled termination signal ODTL generated via the latency control unit 410, the signal combination unit 440 and the signal generation unit 450 satisfies the termination latency regulation, that is, for example, a CWL−1.5.

The latency control unit 410 may be configured to control the latency of the delay-locked termination signal IODTD from the rising edge of the first divided clock signal ICLKD and the rising edge of the first divided clock bar signal ICLKDB, respectively, through the separate signal paths in response to the shift control signals EN<M:0>, and generate the first preliminary signal ODTL_I and the second preliminary signal ODTL_IB.

The latency control unit 410 may include a first latency control section 420 as a separate signal path. The latency control unit 410 may also include a second latency control section 430 as the separate signal paths.

The first latency control section 420 may include a plurality of (for example, M number of) flip-flops 421.

The plurality of flip-flops 421 are inputted with output signals Q of previous flip-flops 421. The plurality of flip-flops 421 are also inputted with the delay-locked termination signal IODTD.

The plurality of flip-flops 421 may be activated in response to signal bits corresponding to them, among the shift control signals EN<M:0>.

The flip-flops 421 activated among the plurality of flip-flops 421 perform latency control by shifting the delay-locked termination signal IODTD from the rising edge of the first divided clock signal ICLKD, and generate the first preliminary signal ODTL_I.

The second latency control section 430 may include a plurality of (for example, M number of) flip-flops 431.

The plurality of flip-flops 431 are inputted with output signals Q of previous flip-flops 431. The plurality of flip-flops 431 are also inputted with the delay-locked termination signal IODTD.

The plurality of flip-flops 431 may be activated in response to signal bits corresponding to them, among the shift control signals EN<M:0>.

The flip-flops 431 activated among the plurality of flip-flops 431 perform latency control by shifting the delay-locked termination signal IODTD from the falling edge of the first divided clock signal ICLKD, and generate the second preliminary signal ODTL_IB.

The signal combination unit 440 may be configured to combine the first preliminary signal ODTL_I and the second preliminary signal ODTL_IB according to the specified signal bit CWLSHIFT<0> among the latency control signals CWLSHIFT<4:0>, the first divided clock signal ICLKD and the second divided clock signal QCLKD, and generate the first combined signal ODTL_R and the second combined signal ODTL_F.

The signal generation unit 450 may be configured to generate the latency-controlled termination signal ODTL in response to the first combined signal ODTL_R and the second combined signal ODTL_F.

Figure 8:
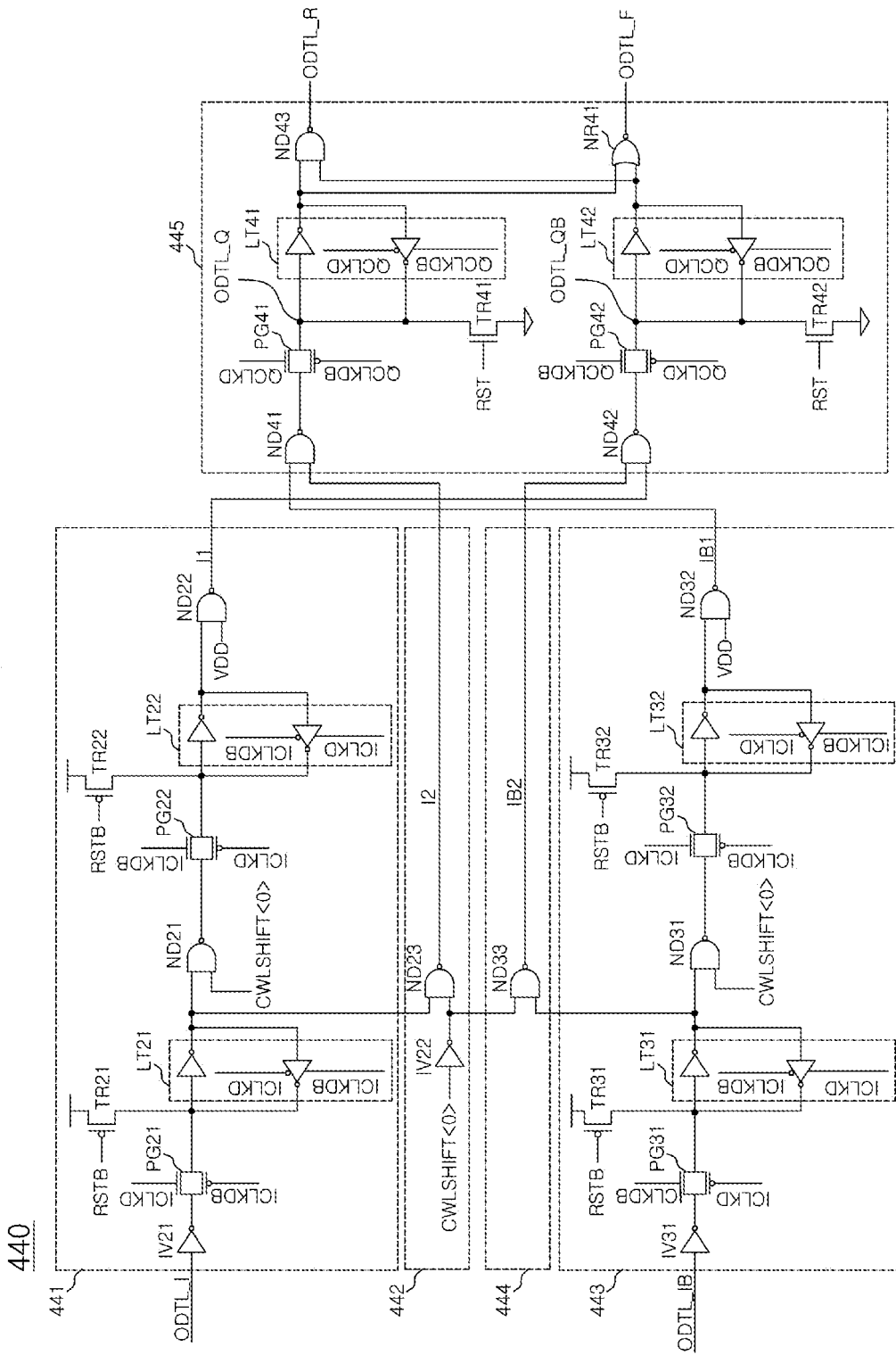
FIG. 8 is an illustration of a representation of a circuit diagram of the signal mixing unit illustrated in FIG. 7.

Referring to FIG. 8, the signal combination unit 440 may be configured to shift the first preliminary signal ODTL_I and the second preliminary signal ODTL_IB by a latency value differently set according to the specified signal bit CWLSHIFT<0> among the latency control signals CWLSHIFT<4:0>, according to the first divided clock signal ICLKD, and generate first to fourth preliminary combined signals I1, I2, IB1 and IB2.

The signal combination unit 440 may be configured to selectively combine the first to fourth preliminary combined signals I1, I2, IB1 and IB2, and generate a first signal ODTL_Q and a second signal ODTL_QB. The first signal ODTL_Q and the second signal ODTL_QB may be generated in synchronization with the second divided clock signal QCLKD.

The signal combination unit 440 may be configured to combine the first signal ODTL_Q and the second signal ODTL_QB, and generate the first combined signal ODTL_R and the second combined signal ODTL_F.

The signal combination unit 440 may include first to fourth paths 441 to 444. The signal combination unit 440 may also include a combination logic 445.

The first path 441 may be configured to shift the first preliminary signal ODTL_I by 1 tCK from the rising edge of the first divided clock signal ICLKD and generate the first preliminary combined signal I1, in the case where the specified signal bit CWLSHIFT<0> is a logic high.

The first path 441 may include an inverter IV21 and a plurality of pass gates PG21 and PG22. The first path 441 may also include a plurality of latches LT21 and LT22, a plurality of NAND gates ND21 and ND22, and a plurality of transistors TR21 and TR22.

The inverter IV21 may invert the first preliminary signal ODTL_I and may output a resultant signal.

In response to the rising edge of the first divided clock signal ICLKD the pass gate PG21 may store the output signal of the inverter IV21 in the latch LT21.

When the specified signal bit CWLSHIFT<0> is at a logic high the NAND gate ND21 may invert the signal stored in the latch LT21 and output a resultant signal.

In response to the falling edge of the first divided clock signal ICLKD the pass gate PG22 may store the output of the NAND gate ND21 in the latch LT22.

The NAND gate ND22 may invert the signal stored in the latch LT22 and output the first preliminary combined signal I1.

In response to a reset signal RSTB the plurality of transistors TR21 and TR22 respectively initialize the plurality of latches LT21 and LT22.

The second path 442 may be configured to shift the first preliminary signal ODTL_I by ½ tCK from the rising edge of the first divided clock signal ICLKD and generate the second preliminary combined signal I2, in the case where the specified signal bit CWLSHIFT<0> is at a logic low.

The second path 442 may include an inverter IV22 and a NAND gate ND23.

The inverter IV22 may invert the specified signal bit CWLSHIFT<0> and output a resultant signal.

The NAND gate ND23 may invert the first preliminary signal ODTL_I shifted by ½ tCK from the rising edge of the first divided clock signal ICLKD, that is, the signal stored in the latch LT21, and output the second preliminary combined signal I2, in the case where the output signal of the inverter IV22 is a logic high (that is, the specified signal bit CWLSHIFT<0> is at a logic low).

The third path 443 may be configured to shift the second preliminary signal ODTL_IB by 1 tCK from the falling edge of the first divided clock signal ICLKD and generate the third preliminary combined signal IB1, in the case where the specified signal bit CWLSHIFT<0> is at a logic high.

The third path 443 may include an inverter IV31 and a plurality of pass gates PG31 and PG32. The third path 443 may also include a plurality of latches LT31 and LT32, a plurality of NAND gates ND31 and ND32, and a plurality of transistors TR31 and TR32.

The inverter IV31 may invert the second preliminary signal ODTL_IB and output a resultant signal.

In response to the falling edge of the first divided clock signal ICLKD the pass gate PG31 may store the output signal of the inverter IV31 in the latch LT31.

When the specified signal bit CWLSHIFT<0> is the logic high the NAND gate ND31 may invert the signal stored in the latch LT31 and output a resultant signal.

In response to the rising edge of the first divided clock signal ICLKD the pass gate PG32 may store the output of the NAND gate ND31 in the latch LT32.

The NAND gate ND32 may invert the signal stored in the latch LT32 and output the third preliminary combined signal IB1.

In response to the reset signal RSTB the plurality of transistors TR31 and TR32 respectively initialize the plurality of latches LT31 and LT32.

The fourth path 444 may be configured to shift the second preliminary signal ODTL_IB by ½ tCK from the falling edge of the first divided clock signal ICLKD and generate the fourth preliminary combined signal IB2, in the case where the specified signal bit CWLSHIFT<0> is at a logic low.

The fourth path 444 may include a NAND gate ND33.

The NAND gate ND33 may invert the second preliminary signal ODTL_IB shifted by ½ tCK from the falling edge of the first divided clock signal ICLKD, that is, the signal stored in the latch LT31, and output the fourth preliminary combined signal IB2, in the case where the output signal of the inverter IV22 is at a logic high (that is, the specified signal bit CWLSHIFT<0> is at a logic low).

The combination logic 445 may be configured to selectively combine the first to fourth preliminary combined signals I1, I2, IB1 and IB2, and generate the first signal ODTL_Q and the second signal ODTL_QB in synchronization with the rising edge and the falling edge of the second divided clock signal QCLKD, respectively.

The combination logic 445 may be configured to generate the first combined signal ODTL_R in response to an earlier rising edge and a later falling edge of the first signal ODTL_Q and the second signal ODTL_QB.

The combination logic 445 may be configured to generate the second combined signal ODTL_F in response to a later rising edge and an earlier falling edge of the first signal ODTL_Q and the second signal ODTL_QB.

The combination logic 445 may include a plurality of NAND gates ND41 to ND43, a NOR gate NR41, and a plurality of pass gates PG41 and PG42. The combination logic 445 may also include a plurality of latches LT41 and LT42 and a plurality of transistors TR41 and TR42.

The NAND gate ND41 may perform a logic function or NAND operation on the preliminary combined signals IB1 and I2 among the first to fourth preliminary combined signals I1, I2, IB1 and IB2, and output a resultant signal.

In response to the rising edge of the second divided clock signal QCLKD the pass gate PG41 may store the output of the NAND gate ND41 in the latch LT41 as the first signal ODTL_Q.

The NAND gate ND42 may perform a logic function or NAND operation on the preliminary combined signals IB2 and I1 among the first to fourth preliminary combined signals I1, I2, IB1 and IB2, and output a resultant signal.

In response to the falling edge of the second divided clock signal QCLKD the pass gate PG42 may store the output of the NAND gate ND42 in the latch LT42 as the second signal ODTL_QB.

The NAND gate ND43 may perform a logic function or NAND operation on the first signal ODTL_Q stored in the latch LT41 and the second signal ODTL_QB stored in the latch LT42, and output the first combined signal ODTL_R.

The NOR gate NR41 may perform a logic function or NOR operation on the first signal ODTL_Q stored in the latch LT41 and the second signal ODTL_QB stored in the latch LT42, and output the second combined signal ODTL_F.

The plurality of transistors TR41 and TR42 may transition the outputs of the plurality of latches LT41 and LT42 to a logic high in response to the reset signal RST, and thereby initialize the first combined signal ODTL_R and the second combined signal ODTL_F.

Figure 9:
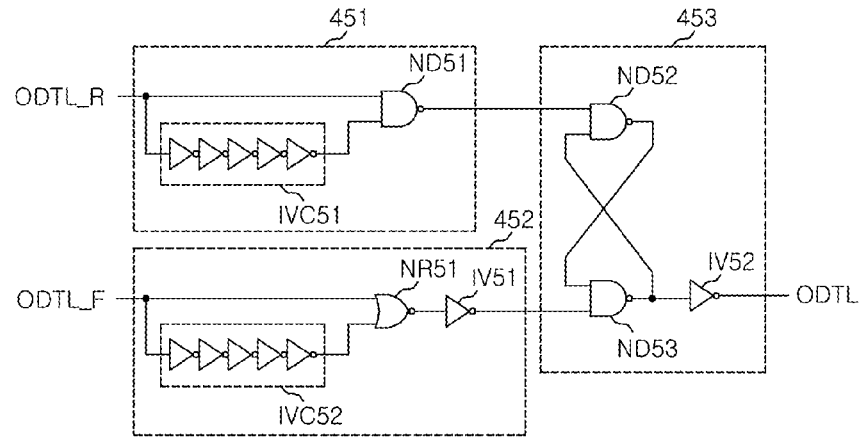
FIG. 9 is an illustration of a representation of a circuit diagram of the signal generation unit illustrated in FIG. 7.

Referring to FIG. 9, the signal generation unit 450 may include a first pulse generating section 451 and a second pulse generating section 452. The signal generation unit 450 may also include a latch 453.

The first pulse generating section 451 may be configured to generate a low pulse in response to the rising edge of the first combined signal ODTL_R.

The first pulse generating section 451 may include an inverter chain IVC51 and a NAND gate ND51.

The second pulse generating section 452 may be configured to generate a low pulse in response to the falling edge of the second combined signal ODTL_F.

The second pulse generating section 452 may include an inverter chain IVC52, a NOR gate NR51, and an inverter IV51.

The latch 453 may be configured to transition the latency-controlled termination signal ODTL to a logic high in response to the output signal of the first pulse generating section 451. The latch 453 may be configured to transition the latency-controlled termination signal ODTL to a logic low in response to the output signal of the second pulse generating section 452.

Figure 10:
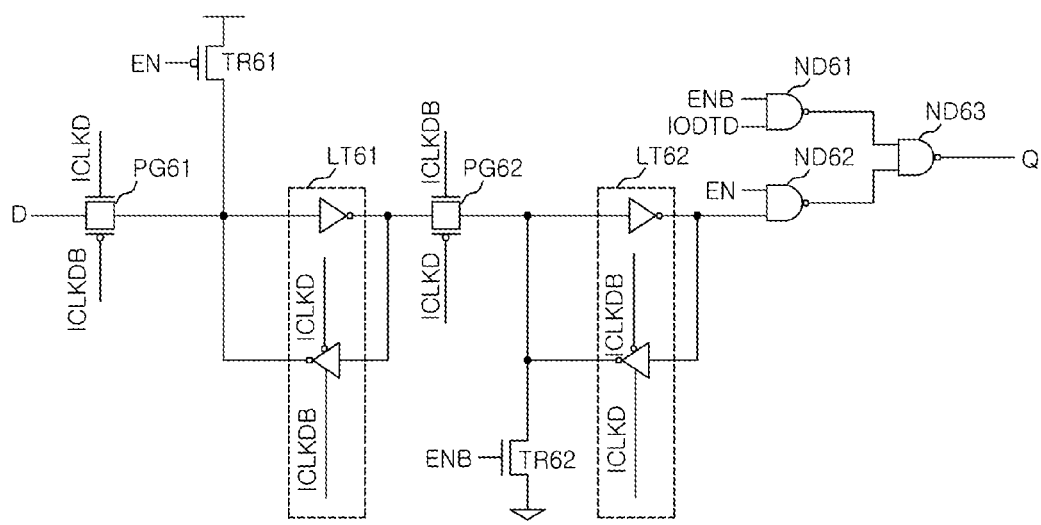
FIG. 10 is an illustration of a circuit diagram illustrating a representation of the configuration of the flip-flop illustrated in FIG. 7.

Referring to FIG. 10, the flip-flop 421 may include a plurality of pass gates PG61 and PG62, a plurality of transistors TR61 and TR62, and a plurality of latches LT61 and LT62. The flip-flop 421 may also include a plurality of logic gates ND61 to ND63.

The pass gate PG61 may store an input signal D, that is, the output signal Q of a previous flip-flop 421, in the latch LT61 in response to the rising edge of the first divided clock signal ICLKD.

In response to the falling edge of the first divided clock signal ICLKD the pass gate PG62 may store the signal stored in the latch LT61, in the latch LT62.

In response to the deactivation of a shift control signal ENB the plurality of logic gates ND61 to ND63 may bypass the delay-locked termination signal IODTD and transmit delay-locked termination signal IODTD to a next flip-flop 421.

In response to the activation of a shift control signal EN the plurality of logic gates ND61 to ND63 transmit the signal stored in the latch LT62, to the next flip-flop 421.

The shift control signal ENB as a signal having a phase opposite to the shift control signal EN may be generated by inverting the shift control signal EN.

The plurality of transistors TR61 and TR62 may control the levels of the signals stored in the plurality of latches LT61 and LT62 in response to the deactivation of the shift control signals EN and ENB, and thereby allow the delay-locked termination signal IODTD to be bypassed through the logic gates ND61 and ND63.

Figure 11:
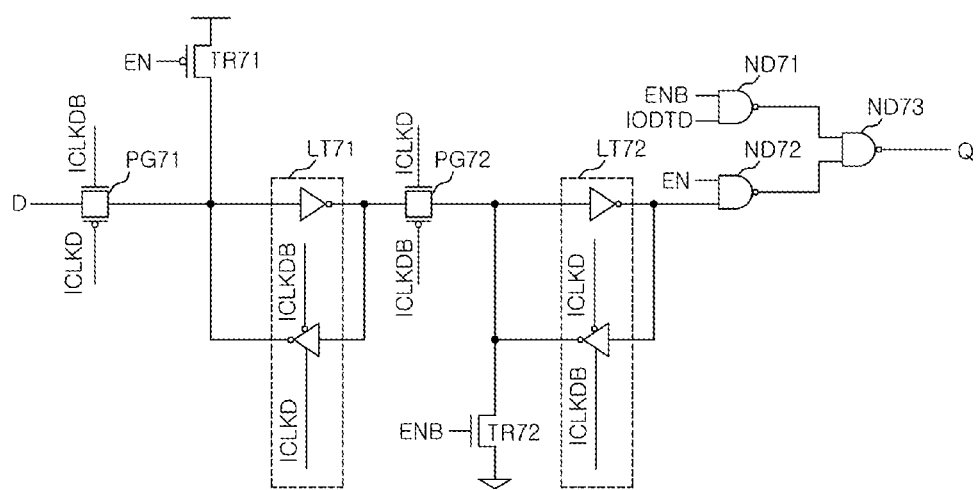
FIG. 11 is an illustration of a circuit diagram illustrating a representation of the configuration of another flip-flop illustrated in FIG. 7.

Referring to FIG. 11, the flip-flop 431 may include a plurality of pass gates PG71 and PG72 and a plurality of transistors TR71 and TR72. The flip-flop 431 may also include a plurality of latches LT71 and LT72 and a plurality of logic gates ND71 to ND73.

In response to the falling edge of the first divided clock signal ICLKD the pass gate PG71 may store an input signal D, that is, the output signal Q of a previous flip-flop 431, in the latch LT71.

In response to the rising edge of the first divided clock signal ICLKD the pass gate PG72 may store the signal stored in the latch LT71, in the latch LT72.

In response to the deactivation of a shift control signal ENB the plurality of logic gates ND71 to ND73 may bypass the delay-locked termination signal IODTD and transmit delay-locked termination signal IODTD to a next flip-flop 431.

In response to the activation of a shift control signal EN the plurality of logic gates ND71 to ND73 may transmit the signal stored in the latch LT72, to the next flip-flop 431.

The plurality of transistors TR71 and TR72 control the levels of the signals stored in the plurality of latches LT71 and LT72 in response to the deactivation of the shift control signals EN and ENB, and thereby allow the delay-locked termination signal IODTD to be bypassed through the logic gates ND71 and ND73.

Figure 12:
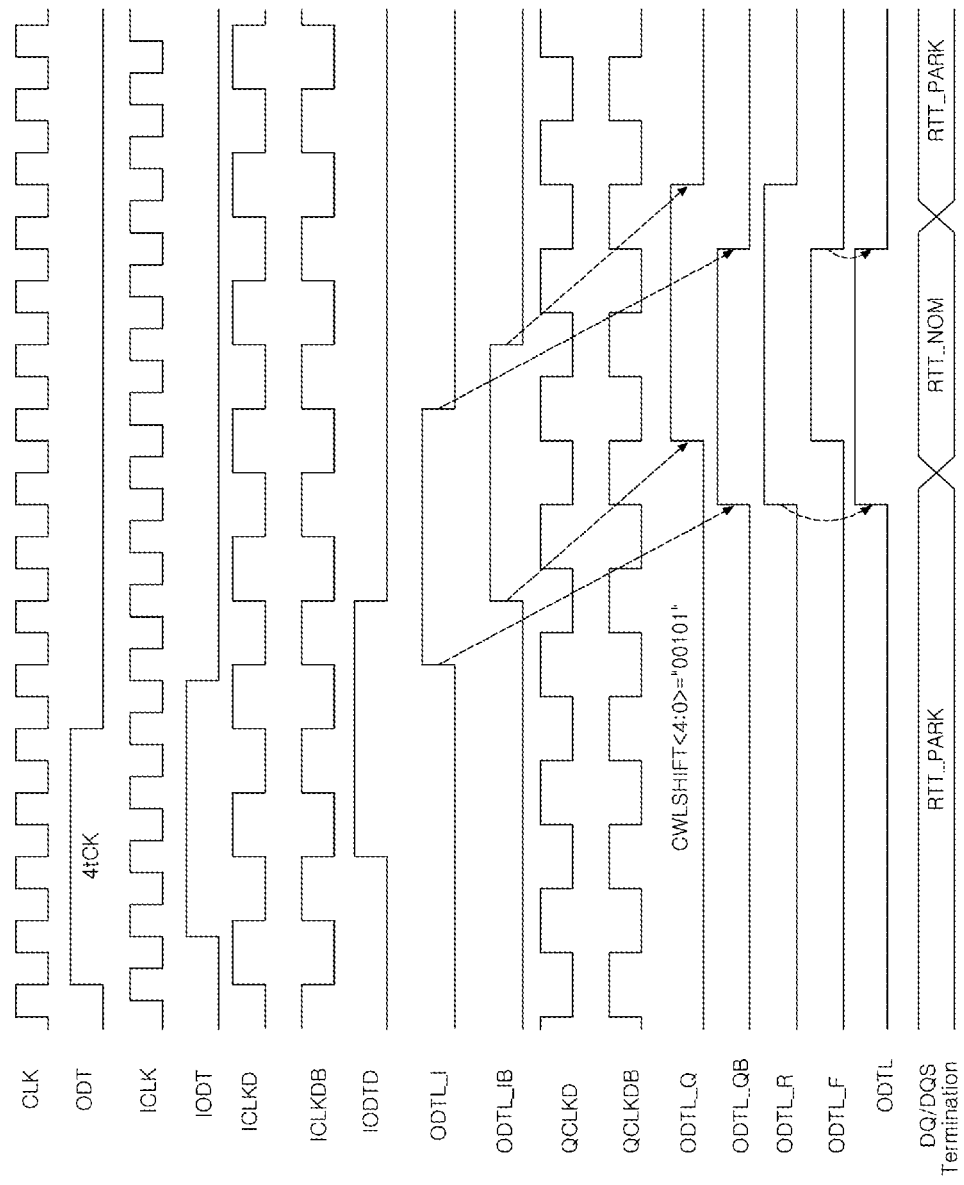
FIGS. 12 to 15 are illustrations of representations of latency control timing diagrams of the semiconductor apparatus in accordance with an embodiment.

The latency control operation of the semiconductor apparatus 101 in accordance with an example of an embodiment where, when the latency control signals CWLSHIFT<4:0> have the value of, for example but not limited to, "00101" and the pulse width of the external termination signal ODT is, for example but not limited to, 4 tCK will be described below with reference to FIG. 12.

The external termination signal ODT with the pulse width of 4 tCK may be inputted on the basis of the external clock signal CLK.

The external termination signal ODT is outputted as the termination signal IODT via the timing control block 400 on the basis of the clock signal ICLK.

The termination signal IODT is outputted as the delay-locked termination signal IODTD via the delay-locked loop 201 on the basis of the first divided clock signal ICLKD.

The delay-locked termination signal IODTD is shifted from the rising edge of the first divided clock signal ICLKD by a value corresponding to the latency control signals CWL-SHIFT<4:1> via the latency control unit 410 of the latency control circuit 301, and thus, the first preliminary signal ODTL_I is generated.

The delay-locked termination signal IODTD is shifted from the falling edge of the first divided clock signal ICLKD by the value corresponding to the latency control signals CWLSHIFT<4:1> via the latency control unit 410 of the latency control circuit 301, and thus, the second preliminary signal ODTL_IB is generated.

Since the latency control signal CWLSHIFT<0> is at a logic high, the first preliminary signal ODTL_I and the second preliminary signal ODTL_IB are respectively shifted according to the first divided clock signal ICLKD through the first path 441 and the third path 443 of the signal combination unit 440, and are outputted as the first signal ODTL_Q and the second signal ODTL_QB by being aligned with the second divided clock signal QCLKD.

The first combined signal ODTL_R transitions to a logic high by an earlier rising edge of the first signal ODTL_Q and the second signal ODTL_QB.

The first combined signal ODTL_R transitions to a logic low by a later falling edge of the first signal ODTL_Q and the second signal ODTL_QB.

The second combined signal ODTL_F transitions to a logic high by a later rising edge of the first signal ODTL_Q and the second signal ODTL_QB.

The second combined signal ODTL_F transitions to a logic low by an earlier falling edge of the first signal ODTL_Q and the second signal ODTL_QB.

The latency-controlled termination signal ODTL transitions to the logic high by the rising edge of the first combined signal ODTL_R through the signal generation unit 450.

The latency-controlled termination signal ODTL transitions to the logic low by the falling edge of the second combined signal ODTL_F through the signal generation unit 450.

The input/output pad (DQ/DQS) 611 of the input/output circuit 601 is terminated to a preset resistance value according to the latency-controlled termination signal ODTL.

The input/output pad 611 of the input/output circuit 601 has a first resistance value RTT_PARK during the deactivation period of the latency-controlled termination signal ODTL, and has a second resistance value RTT_NOM during the activation period of the latency-controlled termination signal ODTL.

Figure 13:
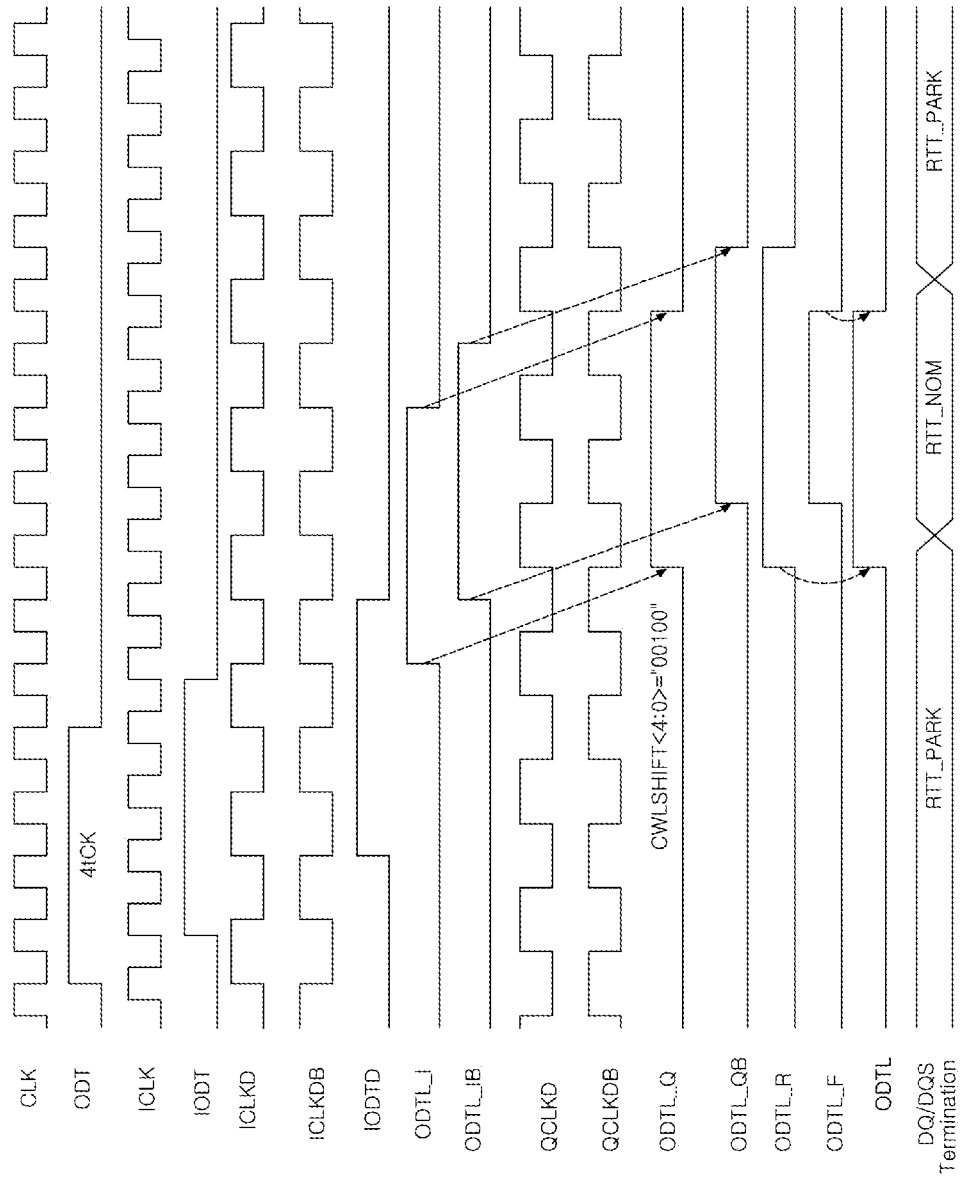

The latency control operation of the semiconductor apparatus 101 in accordance with an example of an embodiment where, when the latency control signals CWLSHIFT<4:0> have the value of, for example but not limited to, "00100" and the pulse width of the external termination signal ODT is, for example but not limited to, 4 tCK will be described below with reference to FIG. 13.

The external termination signal ODT with the pulse width of 4 tCK may be inputted on the basis of the external clock signal CLK.

The external termination signal ODT is outputted as the termination signal IODT via the timing control block 400 on the basis of the clock signal ICLK.

The termination signal IODT is outputted as the delay-locked termination signal IODTD via the delay-locked loop 201 on the basis of the first divided clock signal ICLKD.

The delay-locked termination signal IODTD is shifted from the rising edge of the first divided clock signal ICLKD by a value corresponding to the latency control signals CWL-SHIFT<4:1> via the latency control unit 410 of the latency control circuit 301, and thus, the first preliminary signal ODTL_I is generated.

The delay-locked termination signal IODTD is shifted from the falling edge of the first divided clock signal ICLKD by the value corresponding to the latency control signals CWLSHIFT<4:1> via the latency control unit 410 of the latency control circuit 301, and thus, the second preliminary signal ODTL_IB is generated.

Since the latency control signal CWLSHIFT<0> is at a logic low, the first preliminary signal ODTL_I and the second preliminary signal ODTL_IB are respectively shifted according to the first divided clock signal ICLKD through the second path 442 and the fourth path 444 of the signal combination unit 440, and are outputted as the first signal ODTL_Q and the second signal ODTL_QB by being aligned with the second divided clock signal QCLKD.

The first combined signal ODTL_R transitions to a logic high by an earlier rising edge of the first signal ODTL_Q and the second signal ODTL_QB.

The first combined signal ODTL_R transitions to a logic low by a later falling edge of the first signal ODTL_Q and the second signal ODTL_QB.

The second combined signal ODTL_F transitions to a logic high by a later rising edge of the first signal ODTL_Q and the second signal ODTL_QB.

The second combined signal ODTL_F transitions to a logic low by an earlier falling edge of the first signal ODTL_Q and the second signal ODTL_QB.

The latency-controlled termination signal ODTL transitions to the logic high by the rising edge of the first combined signal ODTL_R through the signal generation unit 450.

The latency-controlled termination signal ODTL transitions to the logic low by the falling edge of the second combined signal ODTL_F through the signal generation unit 450.

The input/output pad (DQ/DQS) 611 of the input/output circuit 601 is terminated to a preset resistance value according to the latency-controlled termination signal ODTL.

The input/output pad 611 of the input/output circuit 601 has a first resistance value RTT_PARK during the deactivation period of the latency-controlled termination signal ODTL, and has a second resistance value RTT_NOM during the activation period of the latency-controlled termination signal ODTL.

Figure 14:
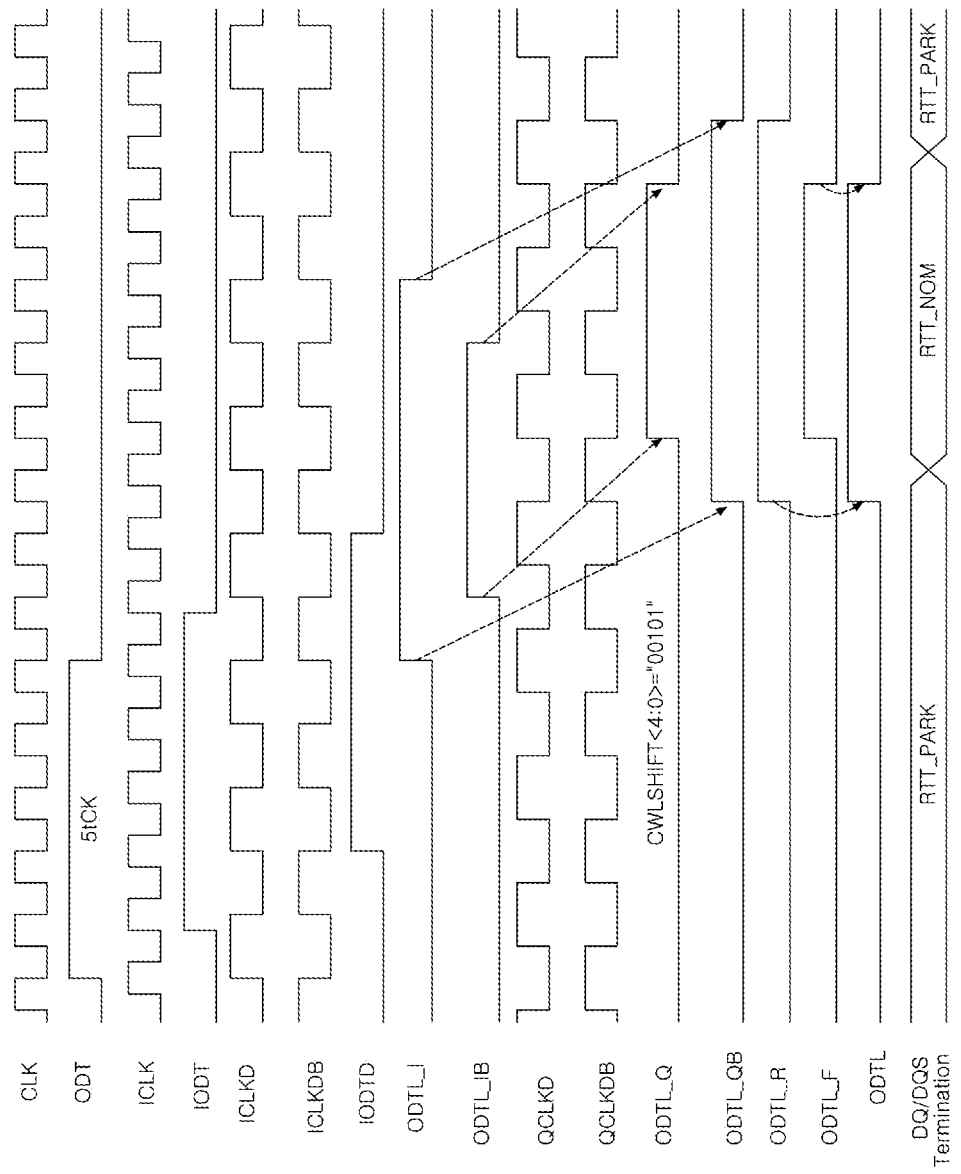

The latency control operation of the semiconductor apparatus 101 in accordance with an example of an embodiment where, when the latency control signals CWLSHIFT<4:0> have the value of, for example but not limited to, "00101" and the pulse width of the external termination signal ODT is, for example but not limited to, 5 tCK will be described below with reference to FIG. 14.

The external termination signal ODT with the pulse width of 5 tCK may be inputted on the basis of the external clock signal CLK.

The external termination signal ODT is outputted as the termination signal IODT via the timing control block 400 on the basis of the clock signal ICLK.

The termination signal IODT is outputted as the delay-locked termination signal IODTD via the delay-locked loop 201 on the basis of the first divided clock signal ICLKD.

The delay-locked termination signal IODTD is shifted from the rising edge of the first divided clock signal ICLKD by a value corresponding to the latency control signals CWLSHIFT<4:1> via the latency control unit 410 of the latency control circuit 301, and thus, the first preliminary signal ODTL_I is generated.

The delay-locked termination signal IODTD is shifted from the falling edge of the first divided clock signal ICLKD by the value corresponding to the latency control signals CWLSHIFT<4:1> via the latency control unit 410 of the latency control circuit 301, and thus, the second preliminary signal ODTL_IB is generated.

Since the latency control signal CWLSHIFT<0> is at a logic high, the first preliminary signal ODTL_I and the second preliminary signal ODTL_IB are respectively shifted according to the first divided clock signal ICLKD through the first path 441 and the third path 443 of the signal combination unit 440, and are outputted as the first signal ODTL_Q and the second signal ODTL_QB by being aligned with the second divided clock signal QCLKD.

The first combined signal ODTL_R transitions to a logic high by an earlier rising edge of the first signal ODTL_Q and the second signal ODTL_QB.

The first combined signal ODTL_R transitions to a logic low by a later falling edge of the first signal ODTL_Q and the second signal ODTL_QB.

The second combined signal ODTL_F transitions to a logic high by a later rising edge of the first signal ODTL_Q and the second signal ODTL_QB.

The second combined signal ODTL_F transitions to a logic low by an earlier falling edge of the first signal ODTL_Q and the second signal ODTL_QB.

The latency-controlled termination signal ODTL transitions to the logic high by the rising edge of the first combined signal ODTL_R through the signal generation unit 450.

The latency-controlled termination signal ODTL transitions to the logic low by the falling edge of the second combined signal ODTL_F through the signal generation unit 450.

As may be readily seen, even through the external termination signal ODT of 5 tCK is inputted, the latency-controlled termination signal ODTL also has the pulse width of 5 tCK.

The input/output pad (DQ/DQS) 611 of the input/output circuit 601 is terminated to a preset resistance value according to the latency-controlled termination signal ODTL.

The input/output pad 611 of the input/output circuit 601 has a first resistance value RTT_PARK during the deactivation period of the latency-controlled termination signal ODTL, and has a second resistance value RTT_NOM during the activation period of the latency-controlled termination signal ODTL.

Figure 15:
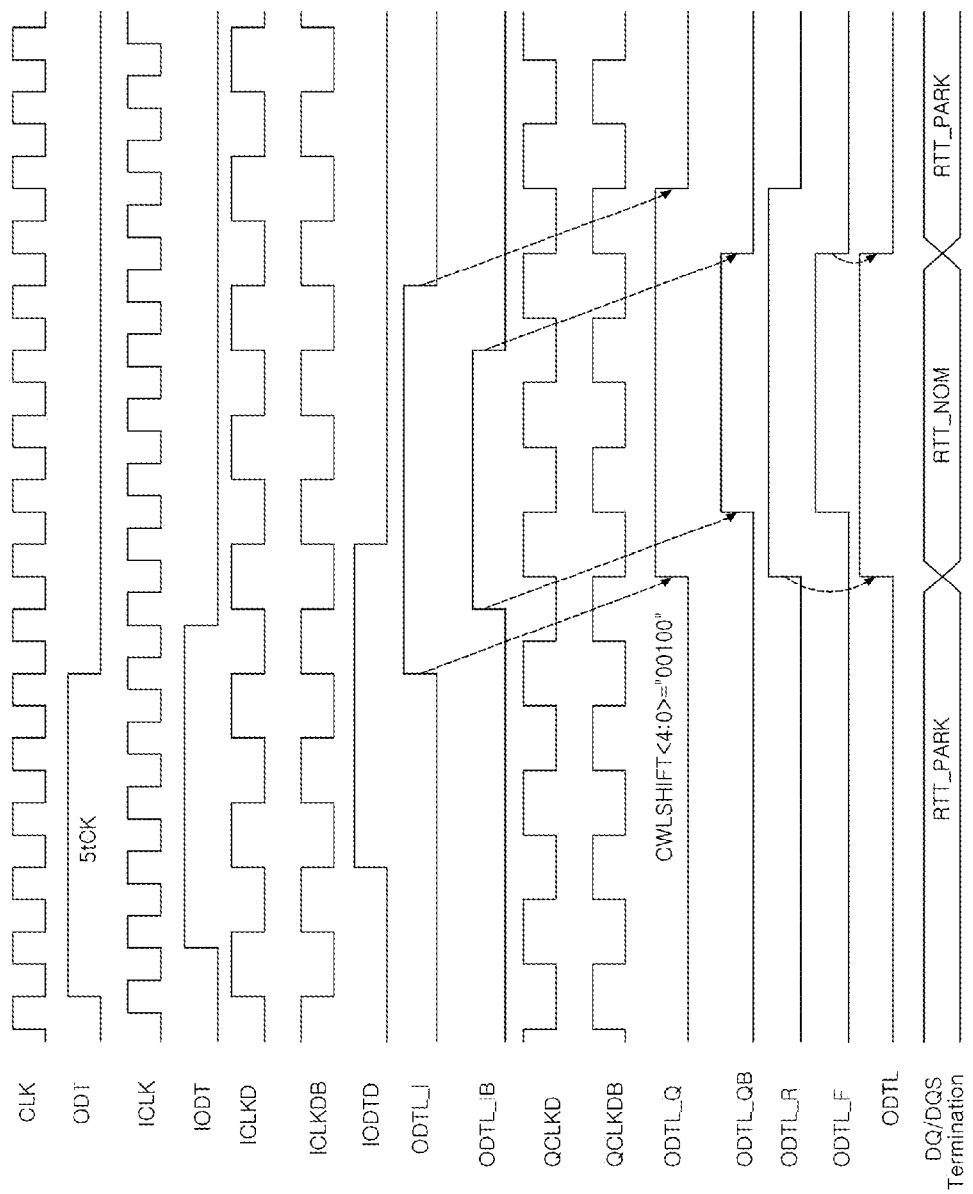

The latency control operation of the semiconductor apparatus 101 in accordance with an example of an embodiment where, when the latency control signals CWLSHIFT<4:0> have the value of, for example but not limited to, "00100" and the pulse width of the external termination signal ODT is, for example but not limited to, 5 tCK will be described below with reference to FIG. 15.

The external termination signal ODT with the pulse width of 5 tCK may be inputted on the basis of the external clock signal CLK.

The external termination signal ODT is outputted as the termination signal IODT via the timing control block 400 on the basis of the clock signal ICLK.

The termination signal IODT is outputted as the delay-locked termination signal IODTD via the delay-locked loop 201 on the basis of the first divided clock signal ICLKD.

The delay-locked termination signal IODTD is shifted from the rising edge of the first divided clock signal ICLKD by a value corresponding to the latency control signals CWLSHIFT<4:1> via the latency control unit 410 of the latency control circuit 301, and thus, the first preliminary signal ODTL_I is generated.

The delay-locked termination signal IODTD is shifted from the falling edge of the first divided clock signal ICLKD by the value corresponding to the latency control signals CWLSHIFT<4:1> via the latency control unit 410 of the latency control circuit 301, and thus, the second preliminary signal ODTL_IB is generated.

Since the latency control signal CWLSHIFT<0> is at a logic low, the first preliminary signal ODTL_I and the second preliminary signal ODTL_IB are respectively shifted according to the first divided clock signal ICLKD through the second path 442 and the fourth path 444 of the signal combination unit 440, and are outputted as the first signal ODTL_Q and the second signal ODTL_QB by being aligned with the second divided clock signal QCLKD.

The first combined signal ODTL_R transitions to a logic high by an earlier rising edge of the first signal ODTL_Q and the second signal ODTL_QB.

The first combined signal ODTL_R transitions to a logic low by a later falling edge of the first signal ODTL_Q and the second signal ODTL_QB.

The second combined signal ODTL_F transitions to a logic high by a later rising edge of the first signal ODTL_Q and the second signal ODTL_QB.

The second combined signal ODTL_F transitions to a logic low by an earlier falling edge of the first signal ODTL_Q and the second signal ODTL_QB.

The latency-controlled termination signal ODTL transitions to the logic high by the rising edge of the first combined signal ODTL_R through the signal generation unit 450.

The latency-controlled termination signal ODTL transitions to the logic low by the falling edge of the second combined signal ODTL_F through the signal generation unit 450.

As may be readily seen, even through the external termination signal ODT of 5 tCK is inputted, the latency-controlled termination signal ODTL also has the pulse width of 5 tCK.

The input/output pad (DQ/DQS) 611 of the input/output circuit 601 is terminated to a preset resistance value according to the latency-controlled termination signal ODTL.

The input/output pad 611 of the input/output circuit 601 has a first resistance value RTT_PARK during the deactivation period of the latency-controlled termination signal ODTL, and has a second resistance value RTT_NOM during the activation period of the latency-controlled termination signal ODTL.

As is apparent from the above descriptions, according to the various examples of the embodiments, latency control for a termination signal may be stably and precisely performed.

Figure 16:
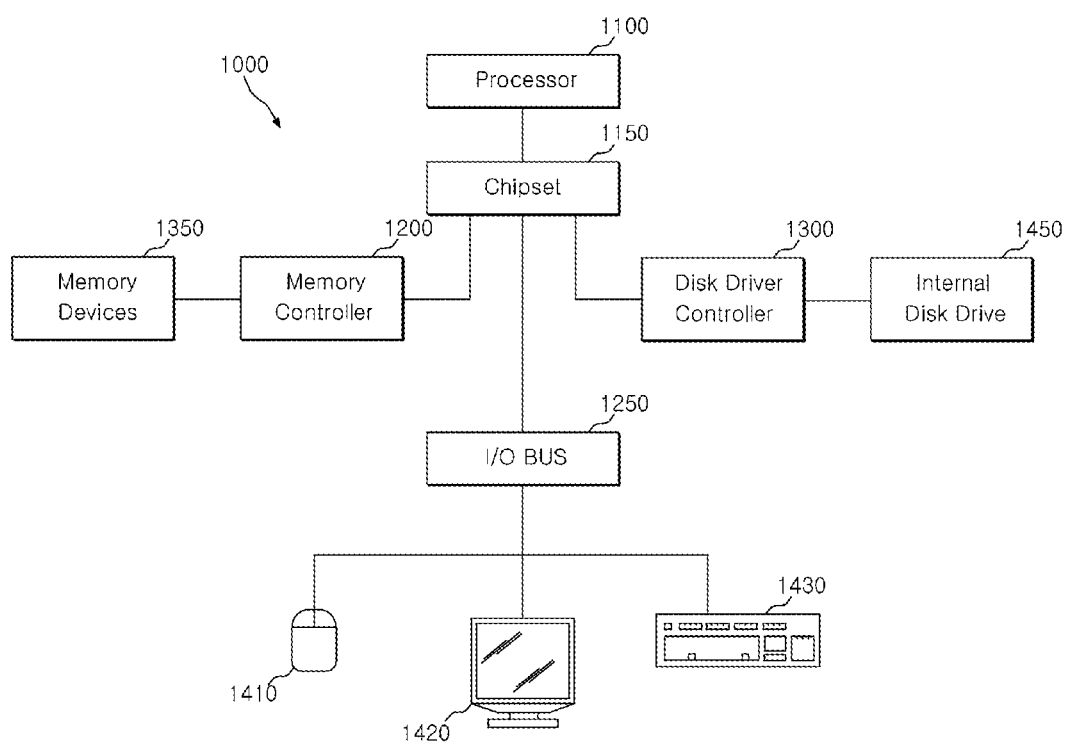
FIG. 16 illustrates a block diagram representation of a system employing the semiconductor apparatus in accordance with the embodiments discussed above with relation to FIGS. 1-15.

The semiconductor system discussed above is particular useful in the design of memory devices, processors, and computer systems. For example, referring to FIG. 16, a block diagram of a system employing the semiconductor apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus as discussed above with reference to FIGS. 1-15 or controller (i.e., as shown in FIG. 1). Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor apparatus as discussed above with relation to FIGS. 1-15, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 16 is merely one example of a system employing the semiconductor apparatus as discussed above with relation to FIGS. 1-15. In alternate embodiments, such as cellular phones or digital cameras, the components may differ from the embodiments shown in FIG. 16.

While various embodiments have been described above, it will be understood to those skilled in the art that the embodiments described are by way of example only. Accordingly, the latency control circuit and the semiconductor apparatus using the same described herein should not be limited based on the described embodiments.

What is claimed is:

1. A latency control circuit comprising:
a first latency control section configured to receive a delay-locked termination signal, control a latency of the delay-locked termination signal according to a first divided clock signal, and generate a first preliminary signal;
a second latency control section configured to receive the delay-locked termination signal, control the latency of the delay-locked termination signal according to a first divided clock bar signal, and generate a second preliminary signal;
a signal combination unit configured to receive the first preliminary signal and the second preliminary signal, shift the first preliminary signal and the second preliminary signal by latency values set differently from each other, according to the first divided clock signal, and generate a first combined signal and a second combined signal; and a signal generation unit configured to generate a latency-controlled termination signal in response to the first combined signal and the second combined signal, wherein the first divided clock bar signal is an inverted first divided clock signal.

2. The latency control circuit according to claim 1, further comprising:

a decoder configured to receive latency control signals, decode the latency control signals, and generate shift control signals for setting latency values of the first and second latency control sections.

3. The latency control circuit according to claim 2, wherein the latency control signals are signals which control a CAS write latency (CWL) value such that the latency-controlled termination signal satisfies a termination latency regulation.

4. The latency control circuit according to claim 2, wherein the decoder is configured to decode signal bits which remain by excluding a specified signal bit among the latency control signals, and generate the shift control signals.

5. The latency control circuit according to claim 4, wherein the latency values of the signal combination unit, set differently from each other, are changeable according to the specified signal bit.

6. The latency control circuit according to claim 2, wherein the signal combination unit is configured to receive the first preliminary signal and the second preliminary signal, combine the first preliminary signal and the second preliminary signal according to a specified signal bit among the latency control signals, the first divided clock signal and a second divided clock signal, and generate the first combined signal and the second combined signal.

7. The latency control circuit according to claim 2, wherein the signal combination unit is configured to receive the first preliminary signal and the second preliminary signal, shift the first preliminary signal and the second preliminary signal by the latency values set differently from each other, according to the first divided clock signal, and generate a plurality of preliminary combined signals, and wherein the signal combination unit is configured to selectively combine the plurality of preliminary combined signals, and generate the first combined signal and the second combined signal in synchronization with a second divided clock signal.

8. The latency control circuit according to claim 1, wherein the first divided clock signal comprises a signal which is divided on the basis of an external clock signal.

9. The latency control circuit according to claim 1, wherein the first latency control section is configured to control the latency of the delay-locked termination signal from a rising edge of the first divided clock signal, and generate the first preliminary signal, and wherein the second latency control section is configured to control the latency of the delay-locked termination signal from a falling edge of the first divided clock signal, and generate the second preliminary signal.

10. The latency control circuit according to claim 9, wherein each of the first latency control section and the second latency control section comprises a plurality of flip-flops.

11. The latency control circuit according to claim 1, wherein the signal generation unit is configured to receive the first combined signal and the second combined signal, and generate the latency-controlled termination signal in response to a rising edge of the first combined signal and a falling edge of the second combined signal.

12. A semiconductor apparatus comprising:

a delay-locked loop configured to perform delay compensation for a termination signal and generate a delay-locked termination signal, and perform delay compensation for an external clock signal and generate a first divided clock signal and a second divided clock signal through division;

a latency control circuit configured to control a latency of the delay-locked termination signal according to the first divided clock signal and a first divided clock bar signal which is generated by inverting the first divided clock signal, respectively, through separate signal paths and generate a first preliminary signal and a second preliminary signal, and combine two signals which are generated by shifting the first preliminary signal and the second preliminary signal by latency values set differently from each other, according to the first divided clock signal and generate a latency-controlled termination signal; and an input/output circuit configured to terminate an input/output pad in response to the latency-controlled termination signal.

13. The semiconductor apparatus according to claim 12, wherein the latency control circuit comprises:

a first latency control section configured to control the latency of the delay-locked termination signal according to the first divided clock signal, and generate the first preliminary signal;

a second latency control section configured to control the latency of the delay-locked termination signal according to the first divided clock bar signal, and generate the second preliminary signal;

a signal combination unit configured to shift the first preliminary signal and the second preliminary signal by the latency values set differently from each other, according to the first divided clock signal, and generate a first combined signal and a second combined signal; and a signal generation unit configured to generate the latency-controlled termination signal in response to the first combined signal and the second combined signal.

14. The semiconductor apparatus according to claim 13, further comprising:

a decoder configured to receive latency control signals, decode the latency control signals, and generate shift control signals for setting latency values of the first and second latency control sections.

15. The semiconductor apparatus according to claim 14, wherein the latency control signals are signals which control a CAS write latency (CWL) value such that the latency-controlled termination signal satisfies a termination latency regulation.

16. The semiconductor apparatus according to claim 14, wherein the decoder is configured to decode signal bits which remain by excluding a specified signal bit among the latency control signals, and generate the shift control signals.

17. The semiconductor apparatus according to claim 16, wherein the latency values set differently from each other are changeable according to the specified signal bit.

18. The semiconductor apparatus according to claim 13, wherein the signal combination unit is configured to receive the first preliminary signal and the second preliminary signal, combine the first preliminary signal and the second preliminary signal according to a specified signal bit among latency control signals, the first divided clock signal and the second divided clock signal, and generate the first combined signal and the second combined signal.

19. The semiconductor apparatus according to claim 13,
wherein the signal combination unit is configured to receive the first preliminary signal and the second preliminary signal, shift the first preliminary signal and the second preliminary signal by the latency values set differently from each other, according to the first divided clock signal, and generate a plurality of preliminary combined signals, and
wherein the signal combination unit is configured to selectively combine the plurality of preliminary combined signals, and generate the first combined signal and the second combined signal in synchronization with the second divided clock signal.

20. The semiconductor apparatus according to claim 13, wherein the signal generation unit is configured to receive the first combined signal and the second combined signal, and generate the latency-controlled termination signal in response to a rising edge of the first combined signal and a falling edge of the second combined signal.

* * * * *